(12) United States Patent
Yee

(10) Patent No.: US 8,144,760 B2
(45) Date of Patent: Mar. 27, 2012

(54) PULSE WIDTH MODULATION CIRCUITS AND METHODS

(75) Inventor: Philip Yee, Los Altos, CA (US)

(73) Assignee: Micrel, Incorporated, San Jose, CA (US)

(*) Notice: Subject to any disclaimer, the term of this patent is extended or adjusted under 35 U.S.C. 154(b) by 934 days.

(21) Appl. No.: 12/024,759

(22) Filed: Feb. 1, 2008

(65) Prior Publication Data
US 2009/0196337 A1    Aug. 6, 2009

(51) Int. Cl.
*H03K 7/08* (2006.01)
*H03K 9/08* (2006.01)

(52) U.S. Cl. ............................ 375/238; 327/37; 332/109

(58) Field of Classification Search .................. 375/238, 375/239; 327/31, 34, 36–38; 329/312, 313; 332/109, 111, 112, 114; 370/212, 213
See application file for complete search history.

(56) References Cited

U.S. PATENT DOCUMENTS

| | | | |
|---|---|---|---|
| 3,978,393 A | 8/1976 | Wisner et al. | |
| 5,777,503 A | 7/1998 | Faulk | |
| 7,130,346 B2 | 10/2006 | Midya et al. | |
| 7,205,754 B2 | 4/2007 | Balakrishnan | |
| 7,245,106 B2 | 7/2007 | Shin et al. | |
| 7,471,133 B1* | 12/2008 | Moussaoui et al. | 327/172 |
| 7,554,479 B2* | 6/2009 | Lim | 341/169 |
| 2007/0013356 A1* | 1/2007 | Qiu et al. | 323/288 |
| 2007/0109825 A1* | 5/2007 | Qiu et al. | 363/41 |

* cited by examiner

*Primary Examiner* — Young T. Tse
(74) *Attorney, Agent, or Firm* — Dorsey & Whitney LLP

(57) ABSTRACT

Noise reducing circuitry may be included in a pulse width modulation circuit. The pulse width modulation circuit may include a comparator adapted to receive an analog signal and a sawtooth signal and to compare such signals to generate a pulse width output. In general, the noise reducing circuitry may include a sawtooth signal generating circuit configured to generate a sawtooth signal including an up ramp and a sawtooth signal including a down ramp. A control circuit may be coupled to the sawtooth signal generating circuit for controlling the sawtooth signal generating circuit based on whether a relatively narrow or relatively wide pulse width is to be output by the pulse width modulation circuit. Methods for reducing noise in a pulse width modulation circuit may generally involve dynamically controlling a direction of ramp of a sawtooth signal that is to be input to the comparator of the pulse width modulation circuit.

20 Claims, 5 Drawing Sheets

PULSE WIDTH MODULATION CIRCUITS AND METHODS

BACKGROUND

The inventive filed relates generally to pulse width modulation circuits and methods for pulse width modulation. The inventive field also relates to reducing noise in pulse width modulation circuits and methods.

Pulse width modulation techniques and methods are well known and have a wide variety of applications. For example, a pulse width modulation circuit may be an integral part of a switcher.

One approach to pulse width modulation is to compare an analog signal to a fixed sawtooth signal, for example, by inputting the analog signal and the sawtooth signal into a comparator. FIG. 1 illustrates operation of a typical pulse width modulation circuit. As illustrated, an analog signal 2 and a sawtooth signal 4 are compared, which results in a square wave output 6. As well understood in the art, the value or amplitude of the analog signal 2 relative to the amplitude of the sawtooth signal 4 will determine a pulse width P of the square wave output 6.

SUMMARY

In general, a pulse width modulation circuit may be provided for use with an analog signal and a predetermined value. The pulse width modulation circuit may include a first comparator that is adapted to receive the analog signal and the predetermined value and configured to provide a control signal based on a comparison of the analog signal and the predetermined value. A control circuit may be coupled to the first comparator for receiving the control signal and may be configured to provide a sawtooth signal with a direction of ramp based on the control signal. A second comparator may be coupled to the control circuit for receiving the analog signal and the sawtooth signal and configured to generate an output based on the analog signal and the sawtooth signal.

Also, noise reducing circuitry may be provided for reducing noise in a pulse width modulation circuit that includes a comparator for use with an analog signal. The noise reducing circuitry may include a sawtooth signal generating circuit coupled to an input of the comparator. The sawtooth signal generating circuit may be configured to generate a sawtooth signal with an up ramp and a sawtooth signal with a down ramp. A control circuit may be coupled to the sawtooth generating circuit for controlling the sawtooth signal generating circuit to generate the sawtooth signal with the up ramp for input into the comparator of the pulse width modulation circuit when a relatively narrow pulse width is to be output by the pulse width modulation circuit and to generate the sawtooth signal with the down ramp for input into the comparator of the pulse width modulation circuit when a relatively wide pulse width is to be output by the pulse width modulation circuit.

A method of controlling input to a comparator of a pulse width modulation circuit may be provided and involve dynamically controlling a direction of a ramp of a sawtooth signal based on a desired output of the comparator. The sawtooth signal and an analog signal may be input to the comparator so that the comparator compares the sawtooth signal and the analog signal to generate the desired output.

BRIEF DESCRIPTION OF THE DRAWINGS

The accompanying drawings, which are somewhat schematic in many instances, and are incorporated in and form a part of this specification, illustrate various details of the invention and, together with the description, serve to explain the principles of the invention.

DETAILED DESCRIPTION OF EMBODIMENTS

Figure 4:
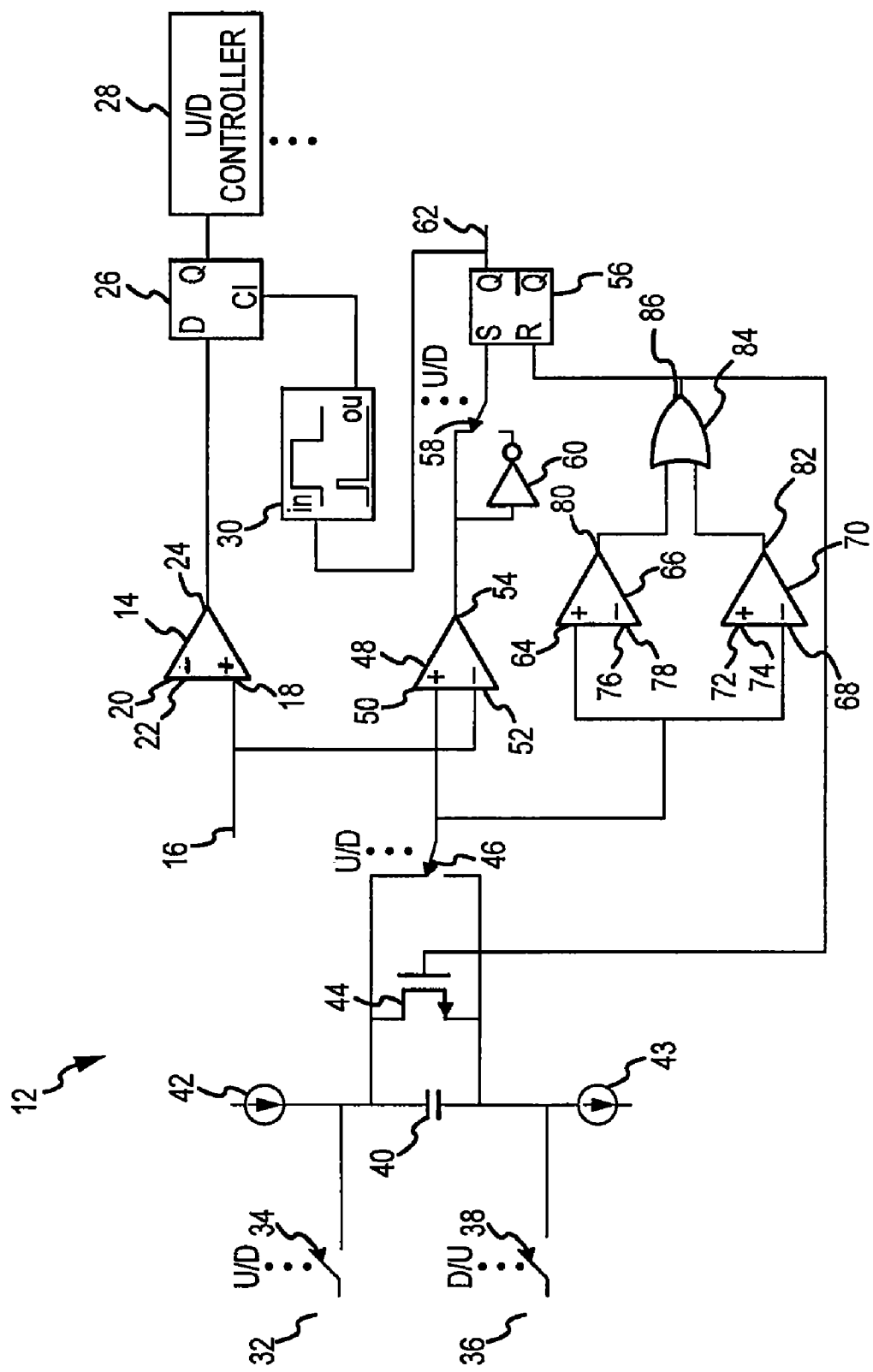
FIG. 4 is a diagrammatic illustration of a pulse width modulation circuit including circuitry for controlling input.
Figure 5:
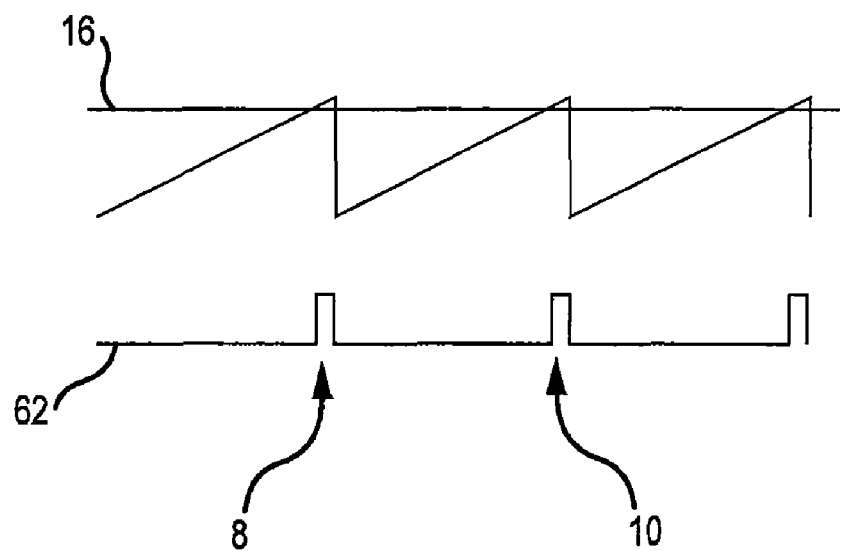
FIG. 5 is a diagrammatic illustration of an operation of the pulse width modulation circuit of FIG. 4 for achieving a relatively narrow pulse.
Figure 6:
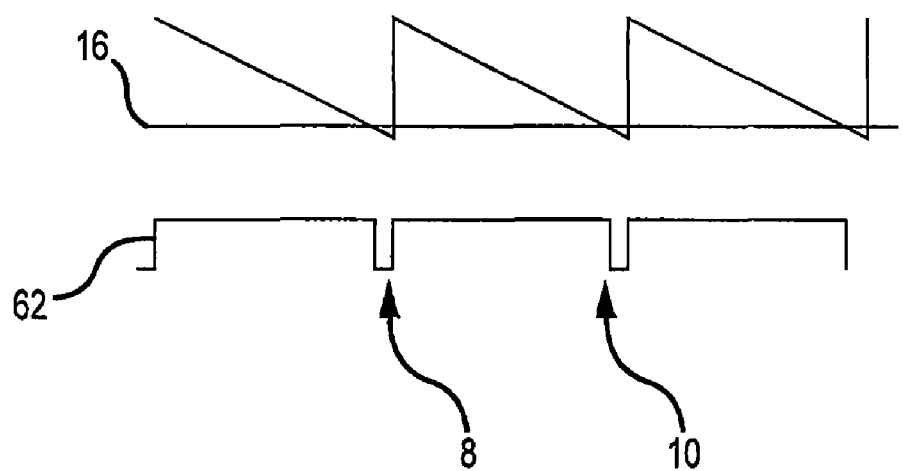
FIG. 6 is a diagrammatic illustration of an operation of the pulse width modulation circuit of FIG. 4 for achieving a relatively wide pulse.
Figure 7:
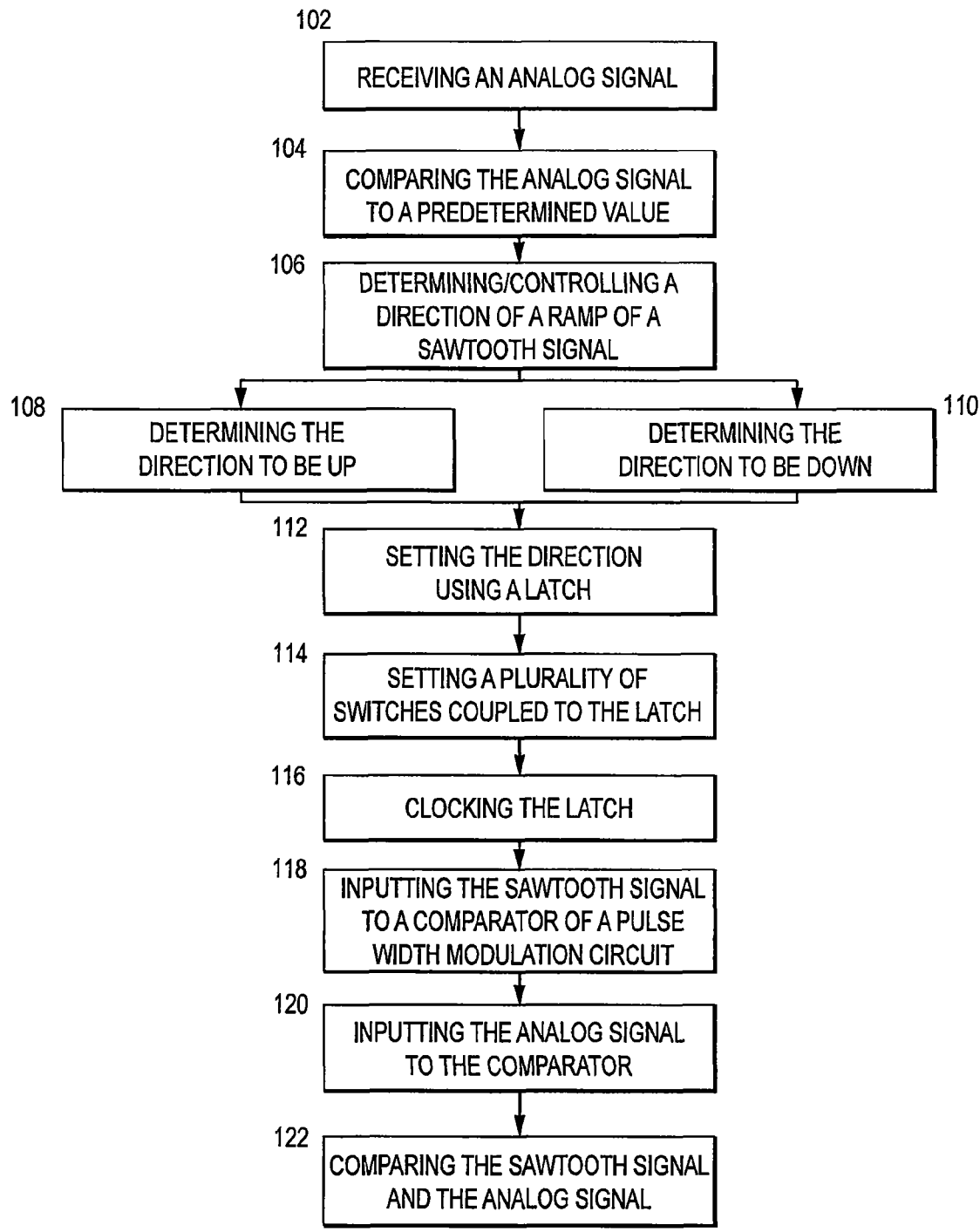
FIG. 7 is a simple block flowchart illustrating a method of controlling input to a comparator of a pulse width modulation circuit.

The circuit shown in FIG. 4, the operational illustrations shown in FIGS. 5 and 6, and the flowchart shown in FIG. 7 are for illustration only and are not intended to represent the only possible methods, configurations and operations. In particular, although a particular arrangement of circuit elements is illustrated in FIG. 4, it should be understood that any suitable arrangement of circuit elements may be envisioned to carry out the intended functions, and thus alternative and equivalent arrangements of elements are intended to be encompassed by the description. Furthermore, method steps may be added, omitted and reordered as may be suitable to a particular application. All details appurtenant to implementing the illustrated circuit and method that are well understood in the art are omitted for simplicity and clarity.

Figure 1:
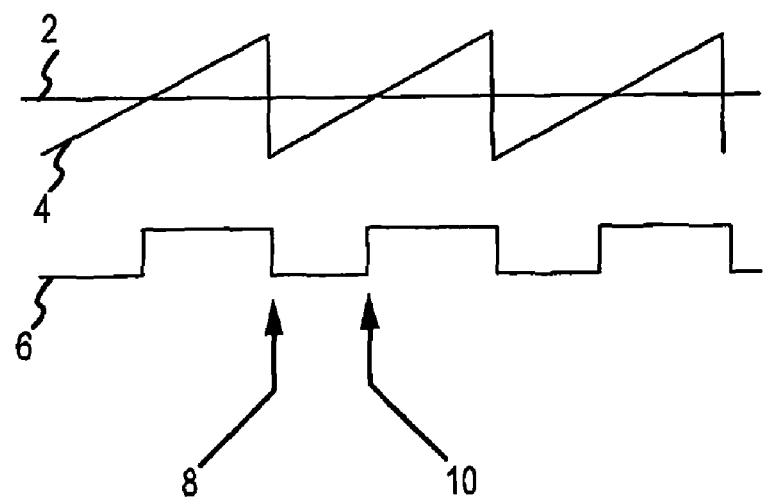
FIG. 1 is a diagrammatic illustration of an operation of a typical pulse width modulator.

In pulse width modulation circuits that employ a comparator, such as discussed above with respect to FIG. 1, two transitions are made by the comparator. A first transition 8 results from a large digital change in the comparator input (as the amplitude of the sawtooth signal drops to zero) and thus may be referred to as the digital transition. A second transition 10 results from a small analog change in the comparator input (as the amplitude of the sawtooth signal becomes greater than the analog signal) and thus may be referred to as the analog transition.

The digital transition 8 and the analog transition 10 have different susceptibility to noise, such as system noise generated by the output switching caused by each edge of the square wave output 6. Because the digital transition 8 results from a large change in the comparator input, the system noise may easily be rejected. However, because the analog transition 10 results from a small change in the comparator input, it may be easily affected by the system noise.

Figure 2:
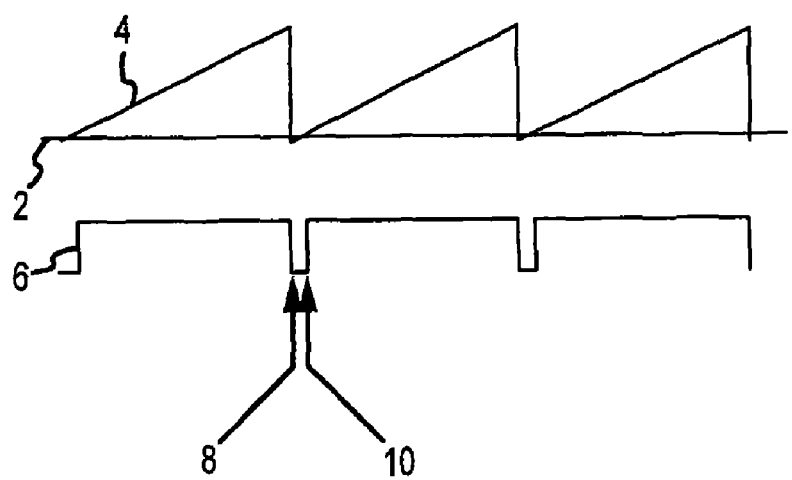
FIG. 2 is a diagrammatic illustration of an operation of the typical pulse width modulator for achieving a relatively wide pulse.

Recognizing the susceptibility to noise of the analog transition 10, it may be understood that achieving a relatively wide pulse width from a comparison of a relatively low value of the analog signal 2 and the sawtooth signal 4 with an up ramp may result in a significantly noisy signal output. For example, as illustrated in FIG. 2, when the analog signal 2 input to the comparator has a relatively low value and the direction of the ramp of the sawtooth signal 4 is up as shown, the analog transition 10 occurs very soon after the digital transition 8. Because the system noise caused by the output switching associated with the digital transition 8 has not had time to settle or dissipate before the analog transition 10 occurs, the analog transition 10 occurs while the system is significantly noisy, resulting in a noisy output signal from the comparator.

Figure 3:
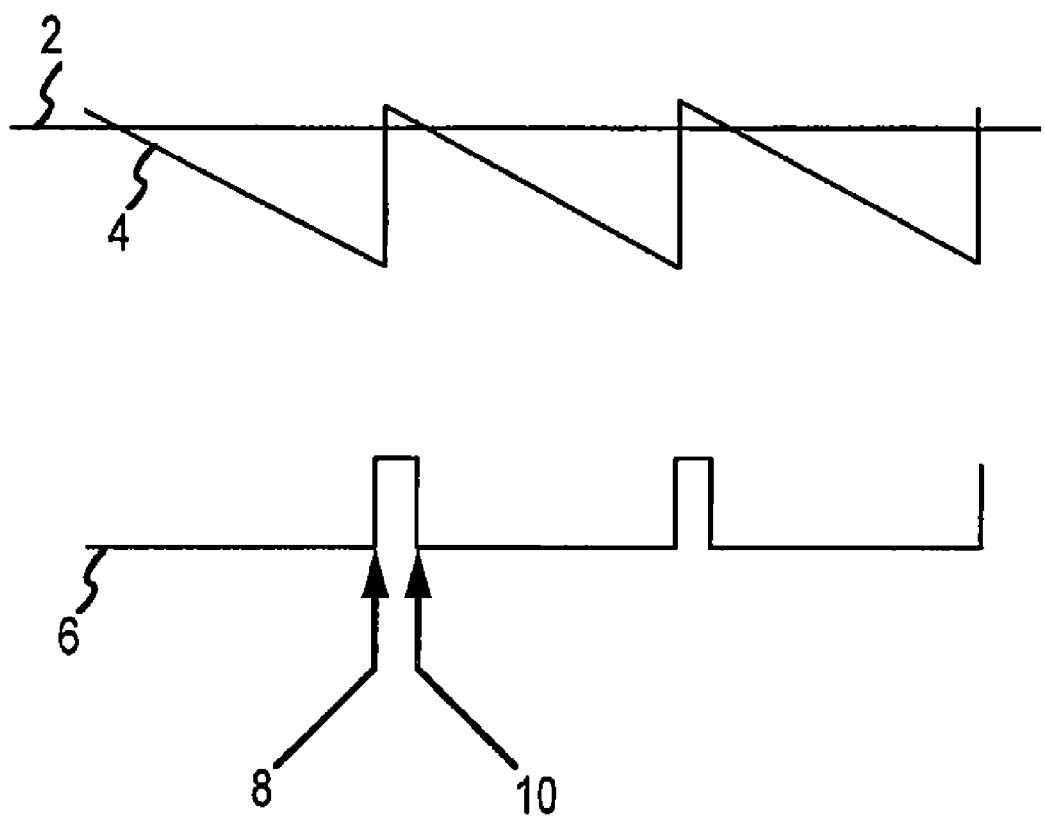
FIG. 3 is a diagrammatic illustration of an operation of the typical pulse width modulator for achieving a relatively narrow pulse.

As will be understood from further discussion herein, a part of a proposed solution to this noise problem is to use the sawtooth signal 4 with a down ramp instead of an up ramp. However, achieving a relatively narrow pulse width from a comparison of a relatively high value of the analog signal 2 and the sawtooth signal 4 with a down ramp may also result in a significantly noisy signal output. For example, as illustrated in FIG. 3, when the analog signal 2 input to the comparator has a relatively high value and the direction of the ramp of the sawtooth signal 4 is down as shown, the analog transition 10 occurs very soon after the digital transition 8. Again, the system noise caused by the output switching associated with the digital transition 8 has not had time to settle or dissipate before the analog transition 10 occurs and the analog transition 10 occurs while the system is significantly noisy, resulting in a noisy output signal from the comparator.

The circuits and methods contemplated herein provide an approach that reduces noise for both narrow and wide pulses. In other words, the circuits and methods described herein are designed to achieve both narrow pulses and wide pulses that are relatively quiet for a given system. For example, an assumption may be made that noise in a system is acceptable at 50% and that noise starts increasing as the digital transition is less than 50% before the analog transition. How close the digital transition may get to the analog transition before noise in the system becomes unacceptable is system dependent. However, embodiments of the circuits and methods contemplated herein provide an approach that may preclude the question by never letting the digital transition get closer than 50% minus hysteresis.

In one embodiment, a pulse width modulation circuit 12, as shown in FIG. 4, may be provided and include a first comparator 14 which may be adapted to receive an analog signal 16 from an error amplifier (not shown), for example, at a first input 18. A second input 20 of the first comparator 14 may be adapted to receive a predetermined value 22. The predetermined value 22 may be any suitable value and may be provided by any suitable source. For example, the predetermined value 22 may be 0.5 volts provided by a voltage source (not shown).

An output 24 of the first comparator 14 may be coupled to a latch 26. The latch 26 may be coupled to an up/down (U/D) controller 28, which may be configured to control a plurality of switches, as discussed below. The latch 26 may be coupled to pulse generator 30, which may be configured to clock the latch 26, as discussed below.

A high signal 32, for example, one volt, may be coupled to a first switch 34 of the plurality of switches controlled by the up/down controller 28, and a low signal 36, for example, zero volts, may be coupled to a second switch 38 of the plurality of switches controlled by the up/down controller 28. The first and second switches 34, 38 may be single-throw switches so as to be either open or closed. The high signal 32 and the low signal 36 may correspond to the maximum and minimum values of the amplitude of the sawtooth signal to be generated.

A capacitor 40 may be coupled to the first and second switches 34, 38 with a first and second current sources 42, 43 provided in series with the capacitor 40. A switching element 44, shown as an n-channel metal-oxide-semiconductor field-effect transistor (MOSFET) or NMOS, although it may generally comprise any suitable switch, may be connected in parallel with the capacitor 40. In general, the first current source 42 may be configured to charge the capacitor 40 to provide an up ramp sawtooth signal and the second current source 43 may be configured to discharge the capacitor 40 to provide a down ramp sawtooth signal.

A third switch 46 may be coupled between the first and second switches 34, 38 and a second comparator 48. The third switch 46 may be a double-throw switch in parallel with the capacitor 40 so as to selectively connect the charging or discharging of the capacitor 40 with a first input 50 of the second comparator 48, as discussed below. A second input 52 of the second comparator 48 may be adapted to receive the analog signal 16.

An output 54 of the second comparator 48 may be provided to a set-reset latch 56, for example, an RS latch or an RS flip-flop, via a fourth switch 58. The fourth switch 58 may be a double-throw switch so as to selectively connect and bypass an inverter 60 provided between the second comparator 48 and the set-reset latch 56, as discussed below. The set-reset latch 56 may be configured to output a pulse-width modulated signal 62 based on the output 54 of the second comparator 48, either via the inverter 60 or bypassing the inverter 60. In general, Set causes Q to go high and Reset causes Q to go low. Set may be controlled by the second comparator 48, individually or in combination with the inverter 60. Reset may be controlled by an OR gate 84. The pulse-width modulated signal 62 may be provided to the pulse generator 30 to clock the latch 26, as discussed below.

The charging or discharging of the capacitor 40 provided to the first input 50 of the second comparator 48 may also be provided to a first input 64 of a third comparator 66 and to a second input 68 of a fourth comparator 70. A first reference value 72 may be provided to a first input 74 of the fourth comparator 70 and a second reference value 76 may be provided to the second input 78 of the third comparator 66. The first reference value 72 may be any suitable value, such as zero volts, and the second reference value 76 may be any suitable value, such as one volt, corresponding to the minimum and maximum values of the amplitude of the sawtooth signal.

Outputs 80, 82 of the third and fourth comparators 66, 70 may be coupled to the OR gate 84. An output 86 of the OR gate 84 is coupled to the set-reset latch 56 and to the switching element 44, as discussed below. A switch (not shown) may be substituted for the OR gate 84, as appropriate or desired, although the OR gate may be easier to implement.

It should be understood that the foregoing circuit elements, either individually or in combination, may be considered to define noise reducing circuitry as described further below. For example, a sawtooth signal generating circuit may include the first and second switches 34, 38, the capacitor 40, the current source 42, the switching element 44, and/or the third switch 46, this list not being exclusive. Similarly, for example, a control circuit may include the first comparator 14, the latch 26, and/or the up/down controller 28, this list not being exclusive. In general, a sawtooth signal generating circuit may be defined by the current source(s) and the capacitor and a control circuit may be defined by switches that allow reversal of the sawtooth ramp direction.

Operation of the pulse width modulation circuit 12 shown in FIG. 4 may be as follows. It should be understood from this description that the pulse width modulation circuit 12 allows the direction of the ramp of the sawtooth signal to be dynamically changed based on the intended output of the pulse width modulation circuit 12, that is, either a relatively wide pulse width signal or a relatively narrow pulse width signal.

A first example is discussed with regard to a relatively high value of the analog signal 16 provided to the first input 18 of the first comparator 14. The high value, for example, may be greater than the predetermined value 22 provided to the second input 20 of the first comparator 14. It should be noted that the first comparator 14 may be provided with hysteresis to deal with the analog signal 16 being equal to the predetermined value 22. In general, moving the analog transition as far away as practical from the digital transition yields better noise immunity. Thus, the ramp direction for the sawtooth signal may be changed at the half-way point. However, general good practice would be to add hysteresis to the comparator to prevent oscillation of the transition, probably around 5% in practice.

The high value of the analog signal 16 causes the output 24 of the first comparator 14 to be a high signal. Input of that high signal to the latch 26 causes the latch to send a signal Q to the up/down controller 28. In this case, the signal Q corresponds to an "up" signal (U), which causes the up/down controller 28 to set the first, second, third and fourth switches 34, 36, 46 and 58 to their respective "up" positions. Specifically, the first switch 34 is opened, the second switch is closed, the third switch 46 toggled upward and the fourth switch 58 is toggled upward.

With the first, second, third and fourth switches 34, 36, 46 and 58 set as such, the first current source 42 gradually charges the capacitor 40 to cause an increasing voltage to be provided to the first input 50 of the second comparator 48. The increasing voltage defines the up ramp of the sawtooth signal being generated. The increasing voltage is also provided to the first input 64 of the third comparator 66. The third comparator 66 thus monitors the increasing voltage to detect when the increasing voltage reaches the second reference value 76, one volt in this example.

The output 80 of the third comparator 66 is thus high, which causes the output 86 of the OR gate 84 to be high, which triggers the switching element 44 to discharge the capacitor 40 to ground. Thus, the signal being provided to the first input 50 of the second comparator 48 abruptly drops to zero volts. This cycle of charging and discharging the capacitor is continued to generate the sawtooth signal with the up ramp as the input to the second comparator 48.

The second comparator 48 compares the sawtooth signal with the up ramp to the analog signal 16, currently the relatively high value, to generate a relatively narrow pulse width signal (corresponding to the relatively high value) as the output 54. The narrow pulse width signal bypasses the inverter 60 to reach the latch 56, which outputs the narrow pulse width signal as the desired output 62 of the pulse width modulation circuit 12. The output 62 is additionally provided to the pulse generator 30, which is configured to clock the latch 26 once per cycle.

This first example, in which a relatively high value of the analog signal 16 is provided to the first input 18 of the first comparator 14, generates a relatively narrow pulse width signal as the output 62 of the pulse width modulation circuit 12, for example, as illustrated in FIG. 5. Because the system noise resulting from the digital transition 8 has time to settle or dissipate before the analog transition 10 occurs, the output 62 of the pulse width modulation circuit 12 is relatively quiet (little noise) for a relatively narrow pulse width.

In general, with an up ramp sawtooth signal, noise immunity may improve as the pulse width signal is narrower. Conversely, with a down ramp sawtooth signal, noise immunity may improve as the pulse width signal is wider. Again, when the noise immunity becomes unacceptable will depend on the details of the system design. Further, clocking latch 26 may prevent the direction of the ramp of the sawtooth signal from changing more than once per cycle, which may prevent potentially erratic behavior.

A second example is discussed with regard to a relatively low value of the analog signal 16 provided to the first input 18 of the first comparator 14. The low value, for example, may be less than the predetermined value 22 provided to the second input 20 of the first comparator 14 (hysteresis being provided to deal with the analog signal 16 being equal to the predetermined value 22, as discussed above).

The low value of the analog signal 16 causes the output 24 of the first comparator 14 to be a low signal. Input of that low signal to the latch 26 causes the latch to send a signal Q to the up/down controller 28. In this case, the signal Q corresponds to a "down" signal (D), which causes the up/down controller 28 to set the first, second, third and fourth switches 34, 36, 46 and 58 to their respective "down" positions. Specifically, the first switch 34 is closed, the second switch is opened, the third switch 46 toggled downward and the fourth switch 58 is toggled downward.

With the first, second, third and fourth switches 34, 36, 46 and 58 set as such, the high signal 32 at the first switch 34 sets the capacitor 40 to one volt. The second current source 43 causes the capacitor 40 to gradually discharge to cause a decreasing voltage to be provided to the first input 50 of the second comparator 48. The decreasing voltage defines the down ramp of the sawtooth signal being generated. The decreasing voltage is also provided to the second input 68 of the fourth comparator 70. The fourth comparator 70 thus monitors the decreasing voltage to detect when the decreasing voltage reaches the first reference value 72, zero volts in this example.

The output 82 of the fourth comparator 70 is thus high, which causes the output 86 of the OR gate 84 to be high, which triggers the switching element 44 to reset the capacitor 40 to one volt by shorting out the capacitor 40 to cause both plates thereof to be at one volt. Thus, the signal being provided to the first input 50 of the second comparator 48 abruptly jumps to one volt. This cycle of discharging and resetting the capacitor is continued to generate the sawtooth signal with the down ramp as the input to the second comparator 48.

The second comparator 48 compares the sawtooth signal with the down ramp to the analog signal 16, currently the relatively low value, to generate a relatively wide pulse width signal (corresponding to the relatively low value) as the output 54. The wide pulse width signal is input to the inverter 60 to reverse the polarity of the signal (resulting from use of the sawtooth signal with a down ramp) before reaching the latch 56, which outputs the wide pulse width signal as the desired output 62 of the pulse width modulation circuit 12. The output 62 is additionally provided to the pulse generator 30, which is configured to clock the latch 26 once per cycle.

This second example, in which a relatively low value of the analog signal 16 is provided to the first input 18 of the first comparator 14, generates a relatively wide pulse width signal as the output 62 of the pulse width modulation circuit 12, for example, as illustrated in FIG. 6. Again, because the system noise resulting from the digital transition 8 has time to settle or dissipate before the analog transition 10 occurs, the output 62 of the pulse width modulation circuit 12 is relatively quiet (little noise) for a relatively wide pulse width.

Various methods for controlling input to a comparator of a pulse width modulation circuit and/or reducing noise in a pulse width modulation circuit may be envisioned based on the foregoing description. For example, such a method may include the operations illustrated by the flowchart of FIG. 7.

The method may begin by receiving an analog signal as an input to the pulse width modulation circuit [BLOCK 102]. The received analog signal may be compared to a predetermined value [BLOCK 104]. Based on the comparison, a direction of a ramp of a sawtooth signal may be determined and/or controlled to generate the sawtooth signal with the desired ramp direction [BLOCK 106].

The determining of the direction of the ramp of the sawtooth signal may include determining the direction of the ramp comprises determining the direction to be up when the analog signal is greater than the predetermined value [BLOCK 108] and determining the direction to be down when the analog signal is less than the predetermined value [BLOCK 110].

The control of the direction of the ramp of the sawtooth signal may be performed dynamically. In particular, controlling the direction of the ramp of the sawtooth signal may include setting the direction using a latch [BLOCK 112]. Setting the direction using a latch may include setting a plurality of switches coupled to the latch [BLOCK 114]. As appropriate or desired, the latch may be clocked to allow the setting of the direction to occur a maximum of once per clock cycle [BLOCK 116].

The generated sawtooth signal may be input to the comparator of the pulse width modulation circuit that is configured to generate a pulse-width modulated signal [BLOCK 118]. The received analog signal may also be input to that comparator [BLOCK 120]. The sawtooth signal may then be compared to the analog signal to generate a desired pulse-width modulated signal as an output of the pulse width modulation circuit [BLOCK 122].

As discussed herein, the predetermined value may be near or equal to half of the value of the amplitude of the sawtooth signal. Similarly, the first reference value may be a minimum value of the amplitude of the sawtooth signal (for example, zero volts) and the second reference value may be a maximum value of the amplitude of the sawtooth signal (for example, one volt) However, it should be understood that the voltage values discussed herein are merely for illustration and are not limiting.

Although various details have been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention.

What is claimed is:

1. A circuit for use with an analog signal and a predetermined value, comprising:
   a control circuit including a first comparator adapted to compare the analog signal and the predetermined value and configured to provide a control signal based on the comparison of the analog signal and the predetermined value;
   a sawtooth signal generating circuit coupled to the control circuit for receiving the control signal and configured to provide a sawtooth signal with a direction of ramp in the form of an up ramp or a down ramp, the direction of the ramp being based on the control signal; and
   a second comparator coupled to the sawtooth signal generating circuit and the control circuit, the second comparator receiving the analog signal and selectively receiving the up ramp or the down ramp of the sawtooth signal and the second comparator being configured to generate an output to the control circuit based on the analog signal and the direction of ramp of the sawtooth signal.

2. The circuit of claim 1, wherein the sawtooth signal generating circuit is configured to provide the sawtooth signal with the up ramp when the analog signal is greater than the predetermined value.

3. The circuit of claim 1, wherein the sawtooth signal generating circuit is configured to provide the sawtooth signal with the down ramp when the analog signal is less than the predetermined value.

4. The circuit of claim 1, wherein the predetermined value is half of an amplitude of the up ramp or the down ramp of the sawtooth signal.

5. The circuit of claim 1, the control circuit further including a latch.

6. The circuit of claim 5, wherein the sawtooth signal generating circuit further includes a plurality of switches coupled to the latch and configured to be set by the latch.

7. The circuit of claim 5, further comprising a pulse generator coupled to the control circuit and a second latch coupled to the pulse generator configured to receive the output of the second comparator, the pulse generator being configured to clock the latch.

8. Pulse width modulation circuitry comprising:
   a comparator having an input and an output;
   a first latch selectively coupleable to the output of the comparator, the first latch configured to output a pulse width modulated signal;
   a sawtooth signal generating circuit coupled to the input of the comparator, the sawtooth signal generating circuit configured to generate a sawtooth signal with an up ramp and a sawtooth signal with a down ramp, wherein the comparator compares an analog signal and either the sawtooth signal with the up ramp or the sawtooth signal with the down ramp and generates the output; and
   a control circuit coupled to the sawtooth signal generating circuit and the first latch, the control circuit including a second latch that provides an output and being configured to control the sawtooth signal generating circuit to generate the sawtooth signal with the up ramp for the input into the comparator when the output of the first latch is to have a relatively narrow pulse width and to generate the sawtooth signal with the down ramp for the input into the comparator when the output of the first latch is to have a relatively wide pulse width.

9. The circuitry of claim 8, the control circuit further including a reference comparator adapted to receive the analog signal and a predetermined value and configured to determine whether the output of the first latch is to have the relatively narrow pulse width or the relatively wide pulse width.

10. The circuitry of claim 9, wherein the control circuit is configured to control the sawtooth signal generating circuit to generate the sawtooth signal with the up ramp when the analog signal is greater than the predetermined value and to control the sawtooth signal generating circuit to generate the sawtooth signal with the down ramp when the analog signal is less than the predetermined value.

11. The circuit of claim 9, wherein the predetermined value is half of an amplitude of the sawtooth signal with the up ramp or the sawtooth signal with the down ramp.

12. A method of controlling a sawtooth signal input to a comparator of a pulse width modulation circuit, comprising:
   selectively controlling a direction of an up ramp or a down ramp of the sawtooth signal input to the comparator based on a control signal of a control circuit; and comparing an analog signal and either the up ramp or down ramp of the sawtooth signal to generate a desired output; and selectively providing the desired output to a latch configured to output a pulse width modulated signal to the control circuit.

13. The method of claim 12, wherein selectively controlling the direction of the up ramp or the down ramp of the sawtooth signal comprises dynamically setting the direction using a second latch within the control circuit.

14. The method of claim 13, wherein dynamically setting the direction using the second latch comprises setting a plurality of switches coupled to the latch.

15. The method of claim 13, further comprising clocking the second latch and allowing the selectively controlled direction of the up ramp or the down ramp of the sawtooth signal to occur a maximum of once per clock cycle.

16. The method of claim 12, wherein selectively controlling the direction of the up ramp or the down ramp of the sawtooth signal is based on noise optimization.

17. The method of claim 16, further comprising:

comparing the analog signal and a predetermined value by an additional comparator within the control circuit; and wherein the selectively controlling the direction of the up ramp or the down ramp of the sawtooth signal includes determining the direction of the sawtooth signal based at least in part upon the comparison of the analog signal and the predetermined value.

18. The method of claim 17, wherein determining the direction of the sawtooth signal comprises determining the direction of the sawtooth signal to be up when the analog signal is greater than the predetermined value and determining the direction of the sawtooth signal to be down when the analog signal is less than the predetermined value.

19. The method of claim 17, wherein the predetermined value is half of an amplitude of the sawtooth signal with the up ramp or the sawtooth signal with the down ramp.

20. The method of claim 19, wherein determining the direction of the ramp of the sawtooth signal comprises determining the direction of the sawtooth signal to be up when the analog signal is greater than the predetermined value and determining the direction of the sawtooth signal to be down when the analog signal is less than the predetermined value.

* * * * *